(12) United States Patent
Amoroso et al.

(10) Patent No.: US 11,521,985 B2
(45) Date of Patent: Dec. 6, 2022

(54) ELECTRO-THERMAL METHOD TO MANUFACTURE MONOCRYSTALLINE VERTICALLY ORIENTED SILICON CHANNELS FOR THREE-DIMENSIONAL (3D) NAND MEMORIES

(71) Applicant: Synopsys, Inc., Mountain View, CA (US)

(72) Inventors: Salvatore Amoroso, Glasgow (GB); Victor Moroz, Mountain View, CA (US)

(73) Assignee: Synopsys, Inc., Mountain View, CA (US)

(*) Notice: Subject to any disclaimer, the term of this patent is extended or adjusted under 35 U.S.C. 154(b) by 58 days.

(21) Appl. No.: 17/139,823

(22) Filed: Dec. 31, 2020

(65) Prior Publication Data
US 2021/0249437 A1 Aug. 12, 2021

Related U.S. Application Data

(60) Provisional application No. 62/956,920, filed on Jan. 3, 2020.

(51) Int. Cl.
*H01L 27/11582* (2017.01)
*H01L 21/02* (2006.01)

(52) U.S. Cl.
CPC .. *H01L 27/11582* (2013.01); *H01L 21/02532* (2013.01); *H01L 21/02598* (2013.01); *H01L 21/02667* (2013.01); *H01L 21/02595* (2013.01)

(58) Field of Classification Search
None
See application file for complete search history.

(56) References Cited

U.S. PATENT DOCUMENTS

| | | | |
|---|---|---|---|
| 2007/0099352 A1 | 5/2007 | Ro et al. | |
| 2012/0028450 A1 | 2/2012 | Son et al. | |
| 2012/0142180 A1 | 6/2012 | Matsushita et al. | |
| 2016/0365353 A1* | 12/2016 | Aoyama | H01L 21/0243 |

OTHER PUBLICATIONS

PCT/US2020/067637 International Search Report and Written Opinion dated Mar. 19, 2021.

* cited by examiner

*Primary Examiner* — Bo B Jang
(74) *Attorney, Agent, or Firm* — Weaver Austin Villeneuve & Sampson LLP

(57) ABSTRACT

A method of forming a multitude of vertical NAND memory cells, includes, in part, forming a multitude of insulating materials on a silicon substrate, forming a trench in the insulating materials to expose a surface of the silicon substrate, depositing a layer of polysilicon along the sidewalls of the trench, filling the trench with oxide, forming a metal layer above the trench, and forming a mono-crystalline channel for the NAND memory cells by applying a voltage between the silicon substrate and the metal layer to cause the polysilicon sidewalls to melt. The melted polysilicon sidewalls is enable to recrystallize into the monocrystalline channel.

19 Claims, 15 Drawing Sheets

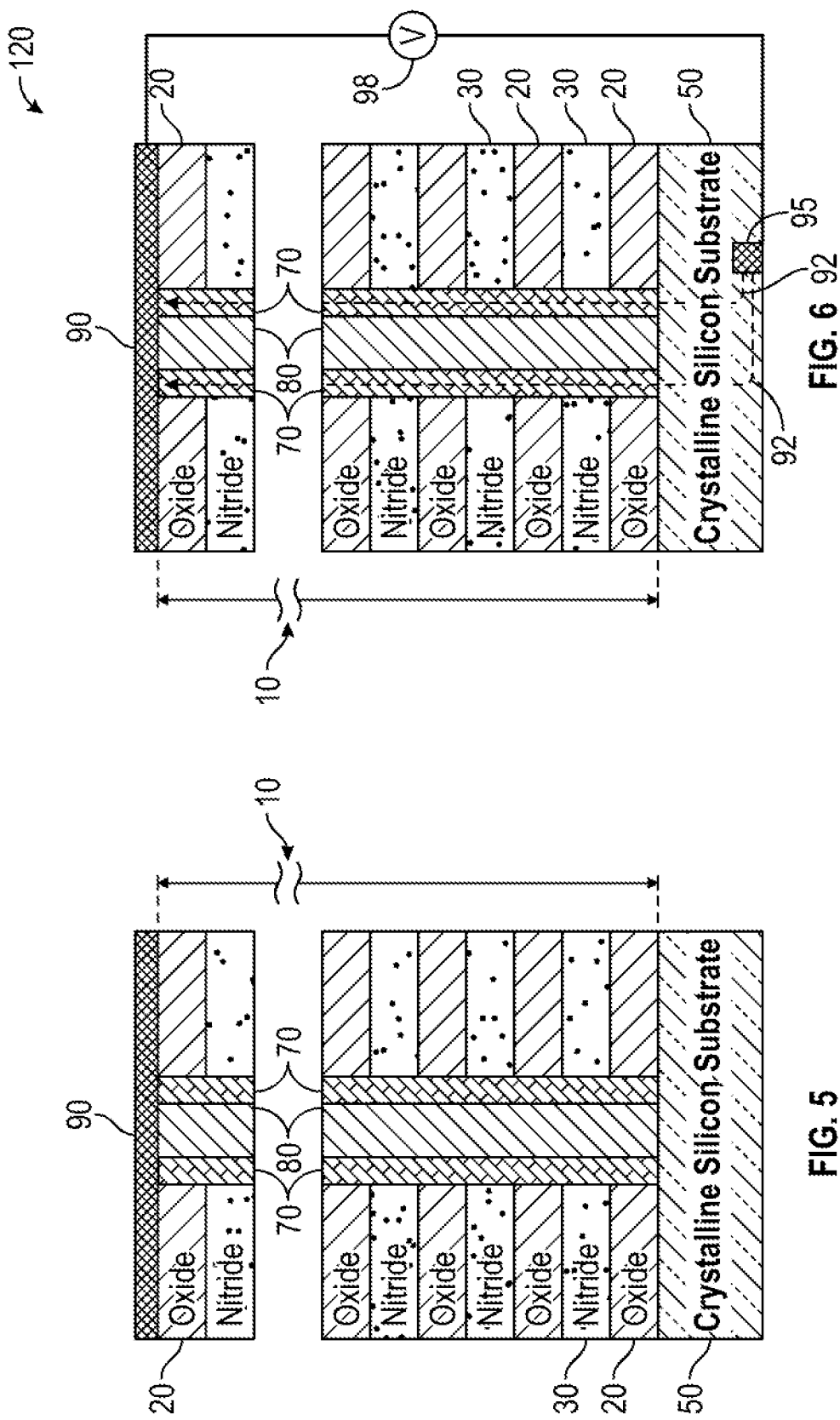

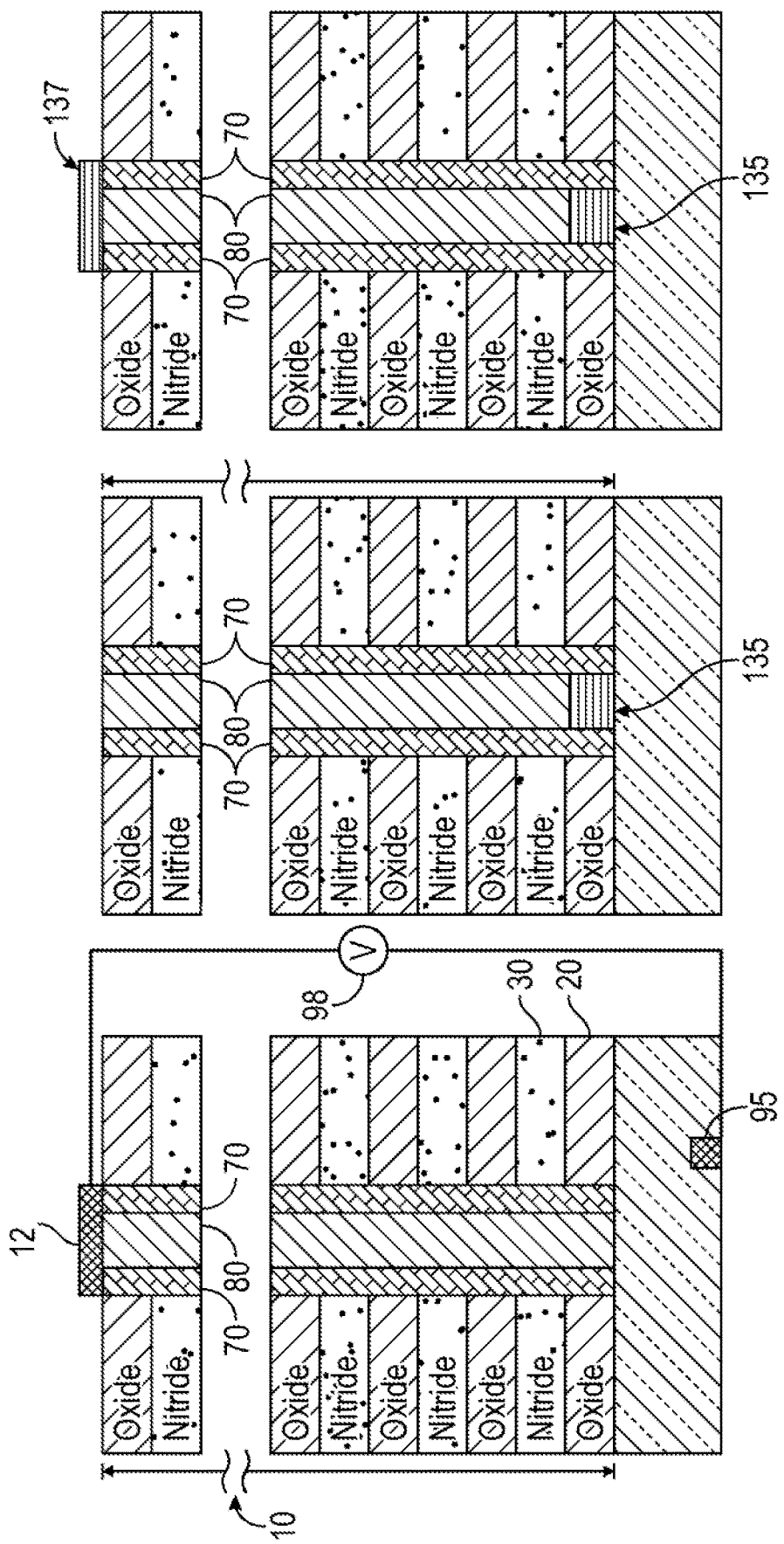

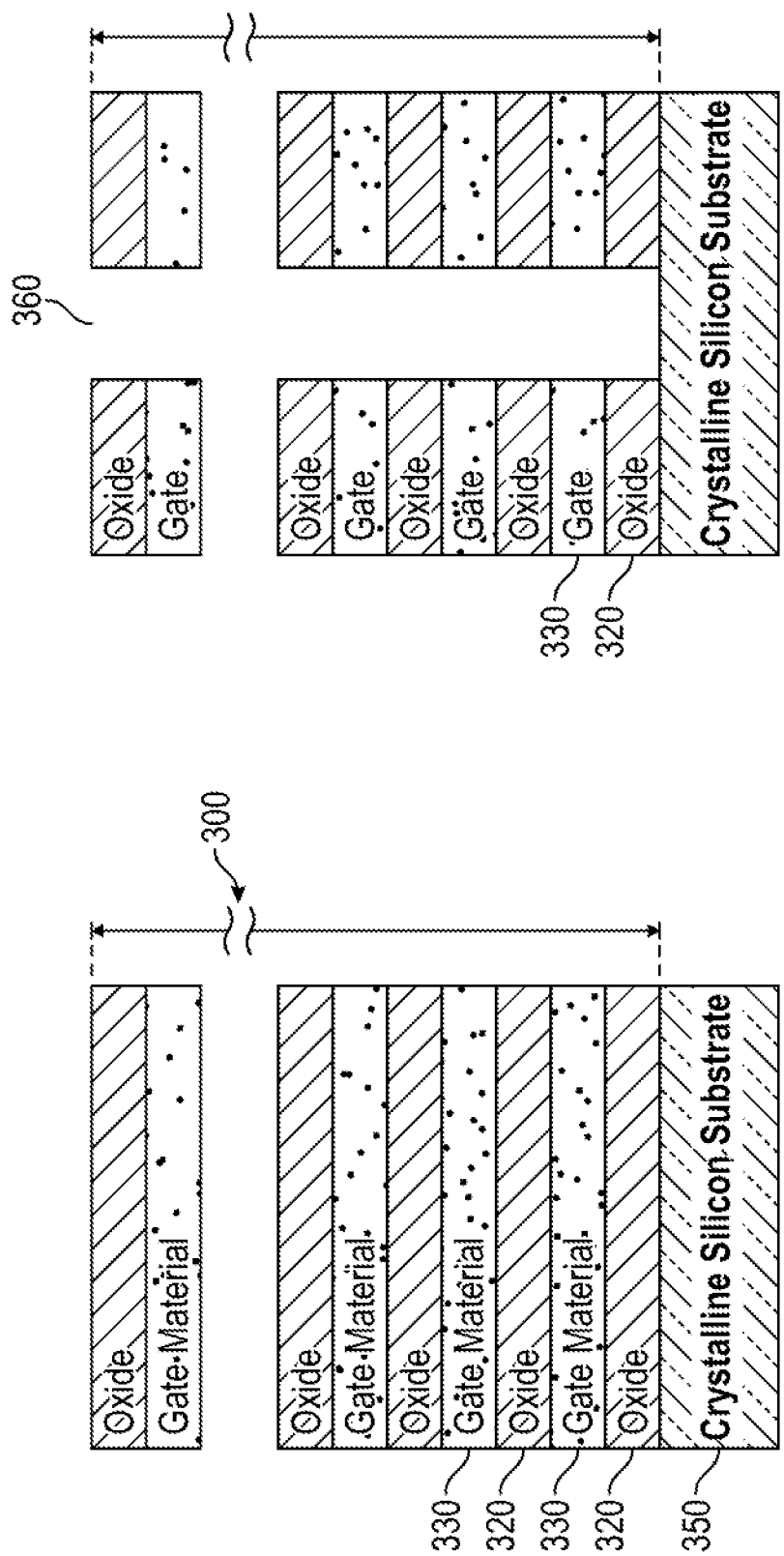

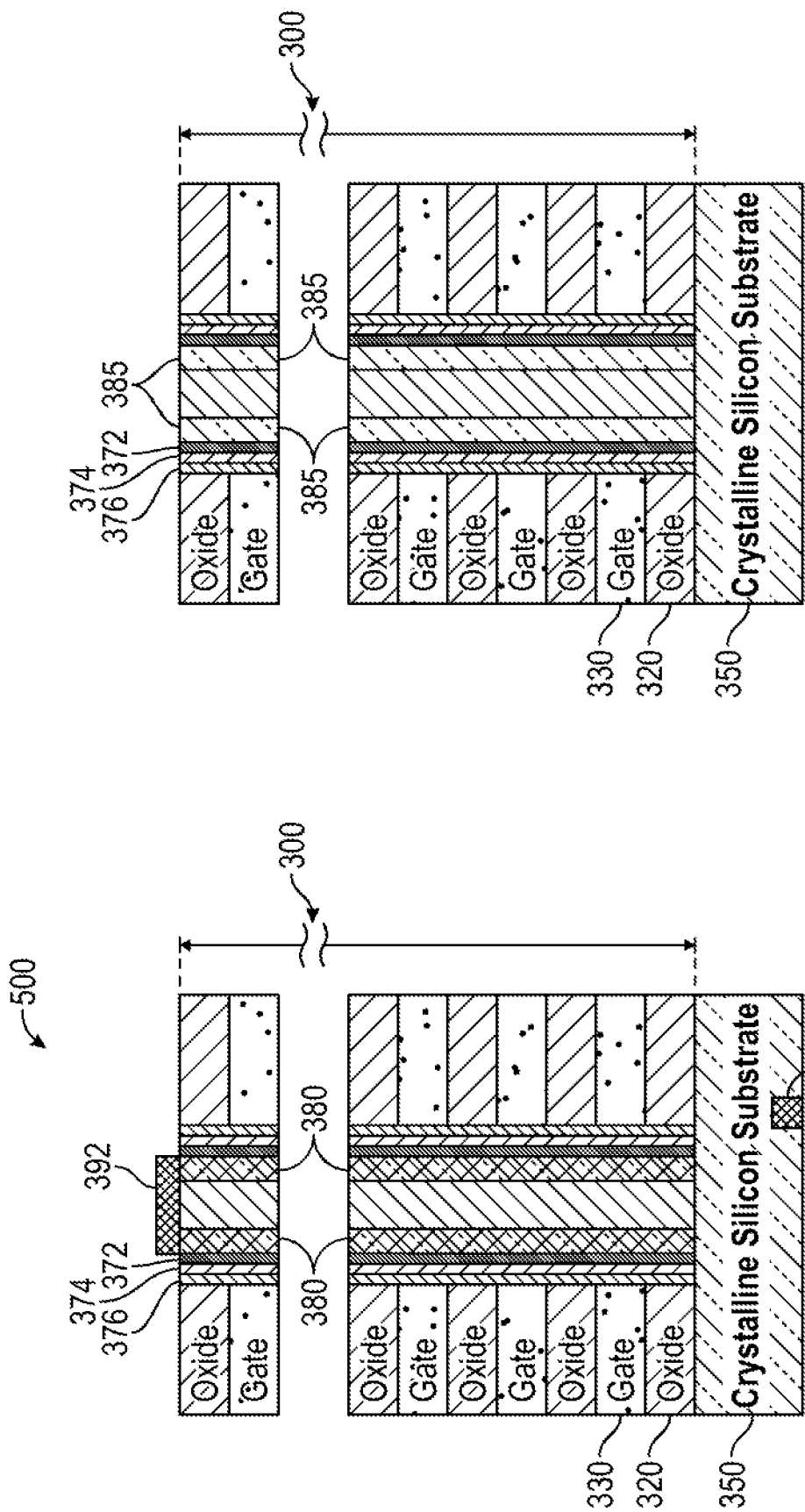

ELECTRO-THERMAL METHOD TO MANUFACTURE MONOCRYSTALLINE VERTICALLY ORIENTED SILICON CHANNELS FOR THREE-DIMENSIONAL (3D) NAND MEMORIES

RELATED APPLICATION

The present application claims benefit under 35 USC 119(e) of U.S. Application Ser. No. 62/956,920 filed Jan. 3, 2020, entitled "Electro-Thermal Method to Manufacture Monocrystalline Vertically Oriented Silicon Channels for Advanced 3D NAND Memories", the content of which is incorporated herein by reference in its entirety.

TECHNICAL FIELD

The present disclosure generally relates to integrated circuit memories and a corresponding integrated circuit memory fabrication system. In particular, the present disclosure relates to a system and method for electro-thermal manufacturing of monocrystalline vertically oriented silicon channels for 3D NAND memories.

BACKGROUND

Advanced NAND memory manufacturing is moving towards vertically stacked strings of NAND memory cells, commonly referred to as three-dimensional NAND or 3D NAND cells. The vertical stack relaxes the requirement on cells' feature sizes, thereby reducing short-channel related effects and cross-talk interference between cells, while increasing the memory density per chip.

SUMMARY

A method of forming a multitude of vertical NAND memory cells, in accordance with one embodiment of the present disclosure includes, in part, forming a multitude of insulating materials on a silicon substrate, forming a trench in the insulating materials to expose a surface of the silicon substrate, depositing a layer of polysilicon along the sidewalls of the trench, filling the trench with oxide, forming a metal layer above the trench, and forming a mono-crystalline channel for the NAND memory cells by applying a voltage between the silicon substrate and the metal layer to cause the polysilicon sidewalls to melt. The melted polysilicon sidewalls is enabled to recrystallize into the mono-crystalline channel.

In one embodiment, the method further includes, in part, forming the metal layer above the multitude of insulating materials. In one embodiment, the method further includes, in part, forming an epitaxial layer near a bottom of the trench. In one embodiment, the method further includes, in part, forming an epitaxial layer near a top of the trench. In one embodiment, the method further includes, in part, removing a portion of the trench and a portion of the insulating materials In one embodiment, the method further includes, in part, applying a multitude of pulses between the metal layer and the substrate after the voltage is applied between the silicon substrate and the metal layer. In one embodiment, the insulating materials includes, in part, alternating layers of oxide and nitride. In one embodiment, the method further includes, in part, removing the nitride layers to form a multitude of openings along the trench. Each such opening is associated with and adapted to form a different one of the multitude of NAND memory cells. The method further includes, in part, depositing at least first and second layers of oxide along the sidewalls and bottom of each opening. The first layer of oxide forms a tunnel oxide of and associated NAND memory cell, and the second layer of oxide forms a storage oxide of an associated NAND memory cell.

In one embodiment, the method further includes, depositing at least a third layer of oxide along the sidewalls and bottom of each opening. In one embodiment, the method further includes, depositing a metal layer in each opening following the deposition of the third layer of oxide. In one embodiment, the voltage applied between the silicon substrate and the metal layer is defined by the resistivity of the polysilicon sidewalls.

A method of forming a multitude of vertical NAND memory cells, in accordance with one embodiment of the present disclosure, includes, in part, forming a multitude of alternating layers of metal and oxide on a silicon substrate, forming a trench in the alternating layers of the metal and oxide to expose a surface of the silicon substrate, depositing a first layer of oxide, a second layer of oxide, and a third layer of oxide along the sidewalls of the trench, depositing a layer of polysilicon along the sidewalls of the trench and adjacent the first layer of the oxide in the trench, filling the trench with oxide, forming a metal layer above the trench, and forming a mono-crystalline channel for the plurality of NAND memory cells by applying a voltage between the silicon substrate and the metal layer to cause the polysilicon sidewalls to melt, and enabling the melted polysilicon sidewalls to recrystallize into the mono-crystalline channel.

In one embodiment, the method further includes, in part, forming the metal layer above the multitude of alternating layers of metal and oxide. In one embodiment, the method further includes, in part, forming an epitaxial layer near a bottom of the trench. In one embodiment, the method further includes, in part, forming an epitaxial layer near a top of the trench. In one embodiment, the method further includes, in part, removing a portion of the trench and a portion of the multitude of alternating layers of metal and oxide.

In one embodiment, the method further includes, in part, applying a multitude of pulses between the metal layer and the substrate after the application of the voltage. In one embodiment, the pulse height applied between a first point in time and a second point in time is higher than the pulse height applied between the second point in time and a third point in time. The first point in time occurs before the second point in time, and the second point in time occurs before the third point in time. In one embodiment, the applied voltage is defined by the resistivity of the polysilicon sidewalls.

A vertical NAND memory structure includes, in part, a silicon substrate, and first and second NAND memory cells. The first NAND memory cell is disposed above the silicon substrate and includes a channel defined by a mono-crystalline silicon substantially perpendicular to the substrate. The first NAND memory cell further includes, in part, a tunnel oxide adjacent the channel, a storage oxide adjacent the tunnel oxide. and a blocking oxide adjacent the storage oxide. The second NAND memory cell is disposed above the silicon substrate and includes the channel defined by the mono-crystalline silicon. The second NAND memory cell further includes, in part, a tunnel oxide adjacent the channel, a storage oxide adjacent the tunnel oxide, and a blocking oxide adjacent the storage oxide.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 5 shows the semiconductor structure of FIG. 4 after formation of a metal layer above the stack, in accordance with one exemplary embodiment of the present disclosure.

FIG. 6 shows the semiconductor structure of FIG. 5 after formation of an ohmic contact in the substrate and application of a voltage between the metal layer and the ohmic contact, in accordance with one exemplary embodiment of the present disclosure.

FIG. 8 shows the semiconductor structure of FIG. 4 after formation of a metal segment above the trench and polysilicon sidewalls, formation of an ohmic contact in the substrate and application of a voltage between the metal segment and the ohmic contact, in accordance with one exemplary embodiment of the present disclosure.

FIG. 9A shows the semiconductor structure of FIG. 3 after deposition of an epitaxial layer in the bottom of the trench, in accordance with one exemplary embodiment of the present disclosure.

FIG. 9B shows the semiconductor structure of FIG. 4 after deposition of an epitaxial layer at the top and bottom of the trench, in accordance with one exemplary embodiment of the present disclosure.

FIG. 15 show a semiconductor structure that includes a stack of alternating layers of silicon dioxide and metal formed above a silicon substrate and used to form a string of vertical 3D NAND memory cells, in accordance with one exemplary embodiment of the present disclosure.

FIG. 16 shows the semiconductor structure of FIG. 15 after formation of a trench in the stack, in accordance with one exemplary embodiment of the present disclosure.

FIG. 23A shows a semiconductor structure that includes, in part, polysilicon sidewalls, metal gates, tunnel oxide, storage oxide and blocking oxide, in accordance with one exemplary embodiment of the present disclosure.

FIG. 23B shows the semiconductor structure of FIG. 23A after the polysilicon sidewalls are caused to melt and recrystallize to form mon-crystalline silicon channels, in accordance with one exemplary embodiment of the present disclosure.

DETAILED DESCRIPTION

A semiconductor process used in fabrication of vertically integrated 3D NAND memory strings may form deep cylindrical trenches through a multilayer stack of materials and subsequent deposition of (i) an amorphous silicon layer to form a vertical channel, and ii) an inner oxide core to improve gate control. The deposited amorphous silicon layer crystallizes during the rest of the fabrication process into polycrystalline silicon grains. The polycrystalline silicon channel has a higher resistance than monocrystalline silicon thus causing a reduction in the performance of the 3D NAND memory cells. Moreover, the grain-to-grain boundaries act as charge-trapping sites thereby leading to additional random-telegraph-noise fluctuations and carrier mobility degradation. Such stochastic instabilities may give rise to significant read/write errors.

One known technique for partially mitigating the impact of the read/write errors is to use an Error Correction Code (ECC) algorithm. However, the circuitry required to perform an ECC algorithm occupies a relatively large silicon area, thereby negating the benefits gained from the vertical 3D NAND cells.

In accordance with embodiments of the present disclosure, a string of 3D NAND memory cells includes vertically integrated channel with monocrystalline silicon. The amorphous silicon and inner-core oxide deposition steps are followed by an electro-thermal annealing and cooling of the semiconductor material In accordance with one aspect of the present disclosure, an electrical current is forced into polysilicon sidewalls thereby to induce local Joule heating and melting of the polysilicon. The melting is aided by the narrow geometry of the polysilicon sandwiched between the oxides.

The presence of a monocrystalline seed, in accordance with one aspect of the present disclosure, serves as the starting point of the channel crystallization during the cooling-off period. During such a period, in accordance with one aspect of the present disclosure, the melted polysilicon is caused to cool down and recrystallize from the seed location, gradually progressing the cooling/crystallization to the rest of the polysilicon.

Figure 2:
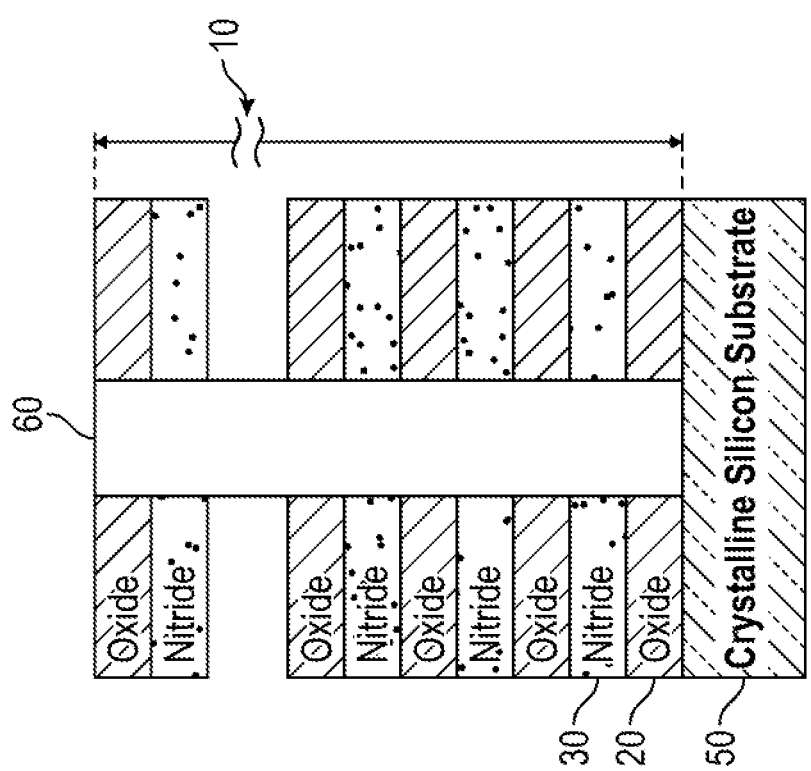
FIG. 2 shows the semiconductor structure of FIG. 1 after formation of a trench in the stack, in accordance with one exemplary embodiment of the present disclosure.
Figure 1:
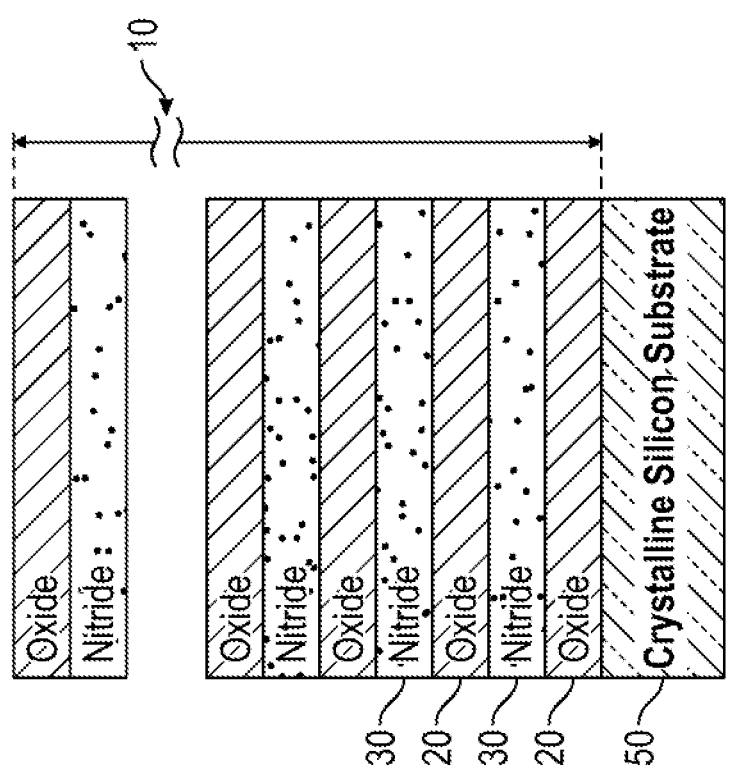
FIG. 1 show a semiconductor structure that includes a stack of alternating layers of silicon dioxide and silicon nitride formed above a silicon substrate and used to form a string of vertical 3D NAND memory cells, in accordance with one exemplary embodiment of the present disclosure.
Figure 4:
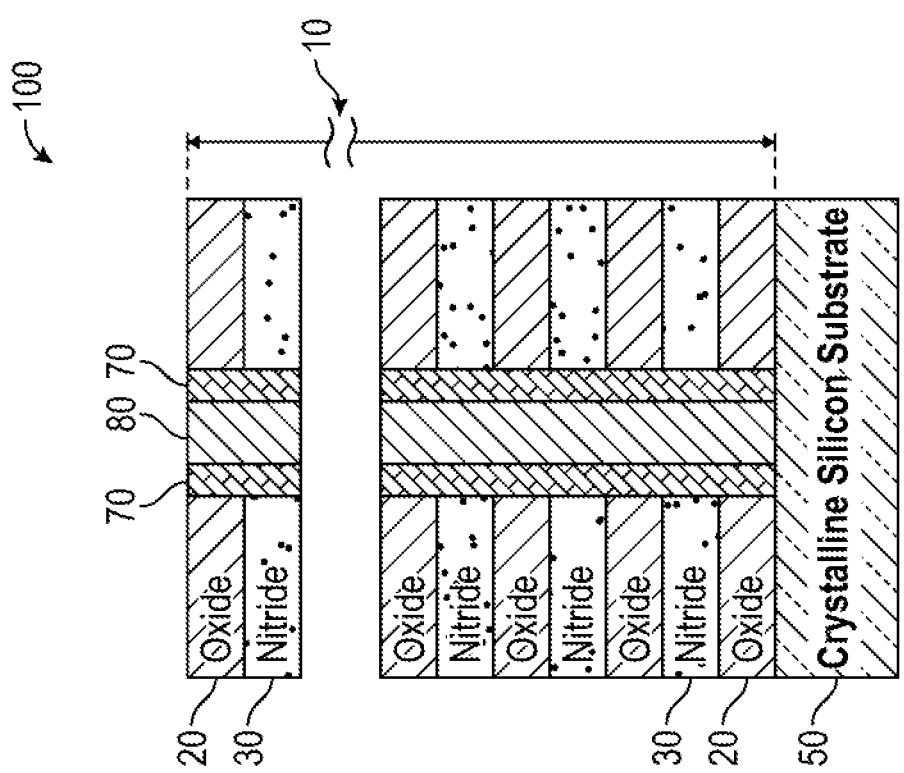
FIG. 4 shows the semiconductor structure of FIG. 3 after filling the trench with silicon dioxide, in accordance with one exemplary embodiment of the present disclosure.
Figure 3:
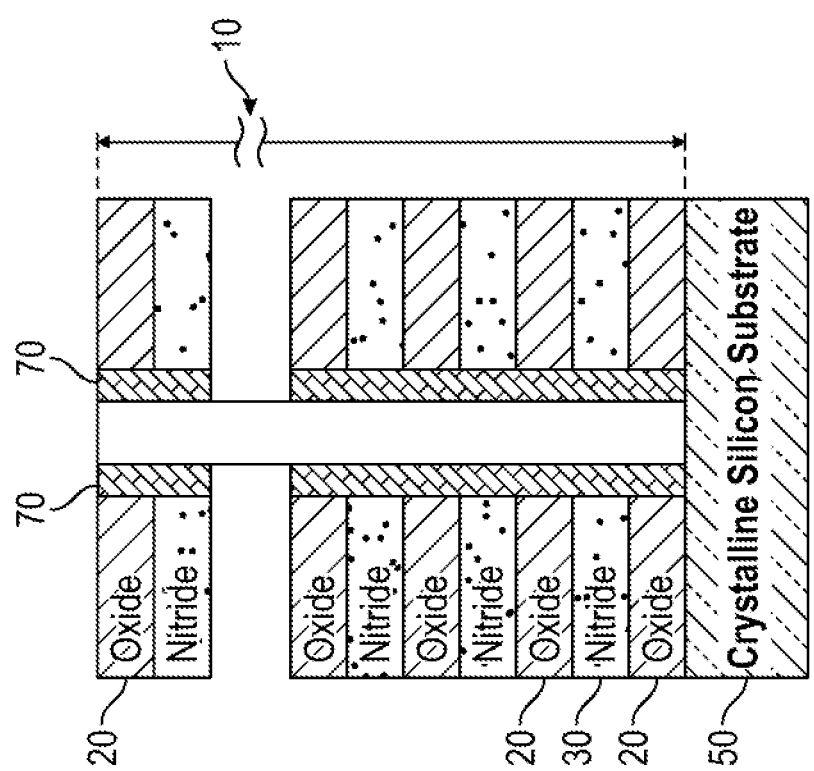
FIG. 3 shows the semiconductor structure of FIG. 2 after formation of polysilicon along the sidewalls of the trench, in accordance with one exemplary embodiment of the present disclosure.

FIG. 1 shows a stack 10 of alternating layers of silicon dioxide (alternatively referred to herein as oxide) 20 and silicon nitride (alternatively referred to herein as nitride) 30 formed over a crystalline silicon substrate 50 (hereinafter alternatively referred to substrate), and used to form a plurality of 3D NAND memory cells in accordance with one embodiment of the present disclosure. It is understood that the figures shown herein are two-dimensional (2D) cross-sectional views of a cylindrical structure. Stack 10 may be made using typical semiconductor processes. Stack 10 of alternating layers of oxide 20 and nitride 30 are insulating materials. Next, using masking and patterning steps, trench 60 is formed in the stack using, for example, a high-aspect ratio reactive ion etch, as shown in FIG. 2. Trench 60 exposes the surface of substrate 50, Next, a layer 70 of polysilicon is deposited along the sidewalls of trench 60, as shown in FIG. 3. Thereafter, as shown in FIG. 4, trench 60 is filled with oxide 80 to from the semiconductor memory structure (alternatively referred to herein as semiconductor structure or memory structure) 100. Oxide 80 improves the electrostatic control and drivability of the channel, as described further below. Next, a layer of metal 90 is deposited on the top of memory structure 100, as shown in FIG. 5, and an ohmic contact 95 is formed at a bottom region of substrate 50 to form memory structure 120, shown in FIG. 6. Metal layer 90 is shown as covering the top oxide of layer 20, trench oxide 80 and polysilicon sidewalls 70.

Thereafter, as shown in FIG. 6, a voltage 98 is applied between metal layer 90 and ohmic contact 95. The voltage level so applied is selected so as to cause the current flowing (shown using dashed lines 92) between the two metal contacts and through the polysilicon sidewalls 70 to cause local melting of the polysilicon sidewalls. The voltage level is determined, in part, by the intrinsic resistance of the polysilicon sidewalls, which form the channel of the 3D NAND memory cell. The relatively small dimension of the channels (alternatively referred to herein nanowires) may increase the electro-thermal efficiency and thus lower the current required to bring the polysilicon sidewalls to a melting point.

The voltage required to melt the polysilicon depends, in part, on the resistivity of the polysilicon. Such resistivity may be changed, for example, by doping of the polysilicon, or by applying a voltage to the control gates (word-lines) of the NAND cells, as described further below. A typical temperature required to induce localized melting of the polysilicon is about 1400° C. The induced temperature should be below 1710° C. to prevent melting of the surrounding oxide. The amplitude, shape and duration of the voltage will depend, in part, on (i) the NAND string length (that may include e.g. 100 memory cells), (ii) the composition of the materials forming the stack and (iii) the thickness of each such material. The power delivered to the channel by means of the applied voltage is defined by $P=V^2/R$, where V represents the voltage amplitude in Volts and R represents the channel string resistance in ohms. The Joule heat Q associated with this power is defined by $Q=P \cdot t$, where t is the duration of the voltage pulse. A substantial part of the heat so generated is dissipated through the substrate, the top interconnects and the lateral sidewalls. A relatively smaller part of the heat causes an increase in the channel temperature. In one example, to achieve the temperature increase required to melt the polysilicon without melting the surrounding oxide, the voltage amplitude and duration are selected so as to induce an energy which is, e.g., 100 to 1000 times higher than the energy delivered to the NAND string during a memory read operation.

Figure 7:
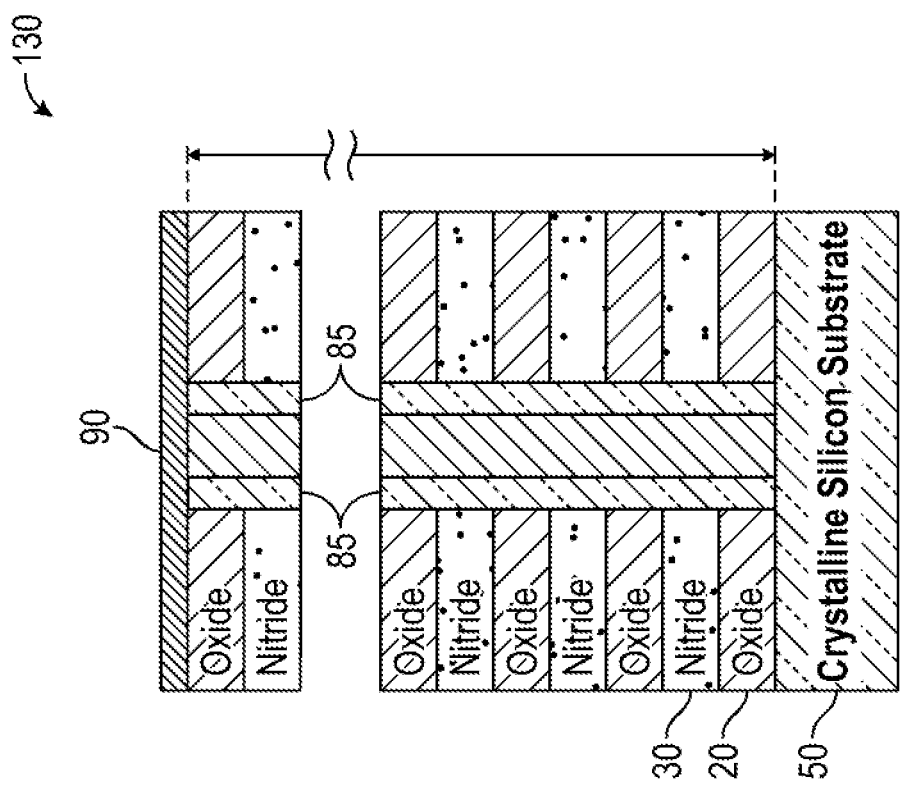
FIG. 7 shows the semiconductor structure of FIG. 6 after melting and recrystallization of the polysilicon sidewalls to form a channel of the 3D NAND memory cells, in accordance with one exemplary embodiment of the present disclosure.

After the melting condition has been established along the polysilicon sidewalls 70—which subsequently form the channel of the memory cells in stack 10 as described further below—the voltage is removed so to enable the melted polysilicon sidewalls to cool down. Because the silicon substrate 50 represents a relatively large heat sink, the melted polysilicon sidewalls will start to cool down and start to crystallize at the interface between the polysilicon sidewalls and silicon substrate 50. The crystallization will then propagate from the bottom of the melted polysilicon sidewalls (i.e., the interface between the polysilicon sidewalls and substrate 50) to the top of the polysilicon sidewalls. Therefore, in accordance with embodiments of the present disclosure, the melting of the polysilicon sidewalls is achieved by the Joule effect and the recrystallization of the melted polysilicon is achieved by the differential and asymmetric heat dissipation. FIG. 7 shows the memory structure of FIG. 6 after the polysilicon sidewalls 70 are melted and re-crystalized to form channels 85 of the NAND memory cell channels in stack 10.

In some embodiments, such as that shown in FIG. 8, the top metal layer 90 is patterned to form a relatively small metal segment 12 covering only the trench filled oxide 80 and the polysilicon sidewalls 70 prior to the application of voltage. The relatively small size of the metal segment 12 reduces heat dissipation therethrough, thereby increasing the electro-thermal effect. Reducing the area of the top metal layer 90 further mitigates premature cooling of the top of the melted polysilicon thus enabling the recrystallizing wave to fully propagate from the bottom near the interface of substrate 50 and polysilicon sidewalls 70.

In some embodiments, after the polysilicon sidewall deposition as shown in FIG. 3, an epitaxial layer of silicon is deposited at the bottom of the trench and then etched so as to form a relatively thin epitaxial layer 135 near the bottom of the trench, as shown in FIG. 9A. Thereafter, the trench is filled with oxide 80. Epitaxial layer 135 forms a crystalline super-seed and increases both the seeding surface as well as the crystallinity propagation efficiency of the melted polysilicon sidewalls. In some embodiments (not shown), the epitaxial layer is formed above substrate 50 and prior to the stack 10 and trench 60 formation. In some embodiments, an epitaxial layer is formed both at the bottom of trench, as well as above the trench. For example, in FIG. 9B, a first epitaxial layer of silicon 135 is shown as having been formed in the trench, and a second epitaxial layer of silicon 137 is shown as having been formed above the trench. In yet other embodiments, an epitaxial layer is formed above the trench and not at the bottom of the trench.

Figure 22B:
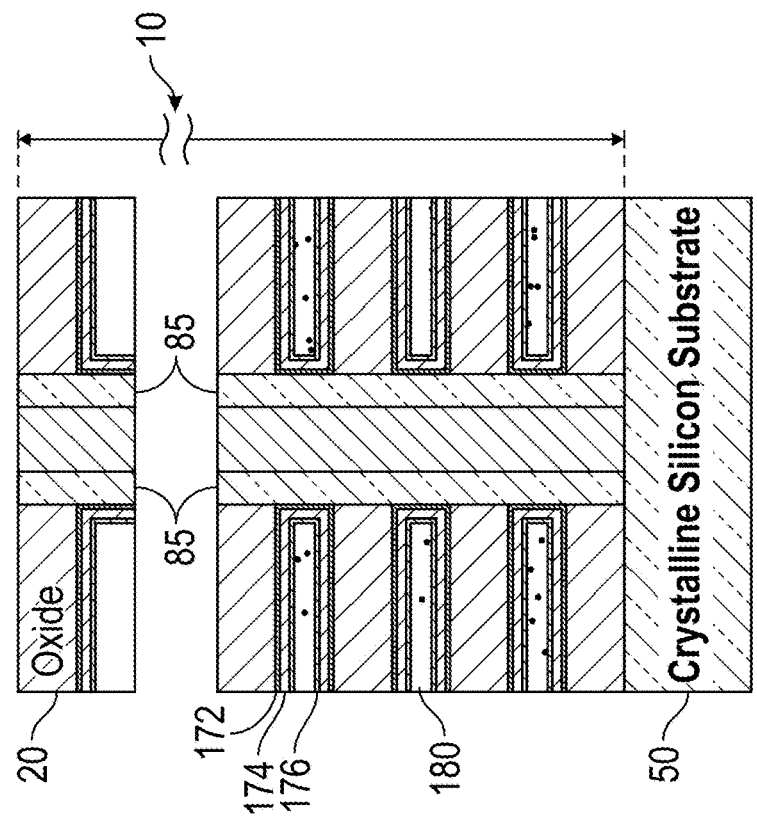
FIG. 22B shows the semiconductor structure of FIG. 22A after the polysilicon sidewalls are caused to melt and recrystallize to form mon-crystalline silicon channels, in accordance with one exemplary embodiment of the present disclosure.
Figure 22A:
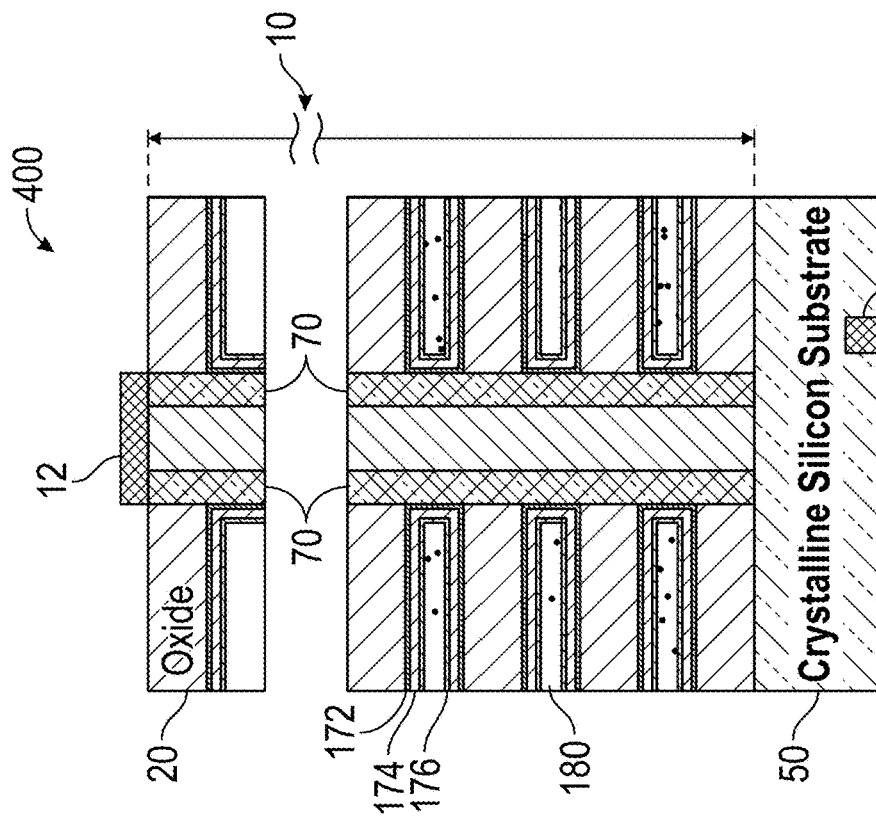
FIG. 22A shows a semiconductor structure that includes, in part, polysilicon sidewalls, metal gates, tunnel oxide, storage oxide and blocking oxide, in accordance with one exemplary embodiment of the present disclosure.

In some embodiments, the polysilicon sidewalls are caused to melt and recrystallize after deposition of the metal gates, the tunnel oxide, the storage oxide and the blocking oxides. FIG. 22A shows a semiconductor memory structure 400 that is similar to the memory structure shown in FIG. 14 except that memory structure 400 includes polysilicon sidewalls that have not been caused to melt and recrystallize. After application of a voltage (not shown) between metal layer 12 and ohmic contact 95 of memory structure 400, polysilicon sidewalls 70 are caused to melt and recrystallize to form mono-crystalline silicon channels. FIG. 22B shows the memory structure of FIG. 22A after the application of such a voltage subsequent to which polysilicon sidewalls 70 are caused to melt and recrystallize to form mono-crystalline silicon channels 85. Referring to FIG. 22A, by varying the voltage applied to metal gates 180, and therefore, by changing the resistivity of polysilicon sidewalls 70, the voltage level required to cause polysilicon sidewalls 70 to melt may be varied.

A method of forming a multitude of vertically oriented NAND memory cells, in accordance with one embodiment of the present disclosure, includes, in part, forming a multitude of alternating layers of first and second insulators on a silicon substrate to form a stack, forming a trench that exposes a surface of the silicon substrate in the multitude of first and second insulators, depositing a layer of polysilicon along sidewalls of the trench, filling the trench with oxide, forming a metal layer above the trench, removing the first insulator layers form the stack to form a multitude of openings along the trench. Each such opening is associated with and adapted to one of the NAND memory cells. The method further includes, in part, depositing at least first, second and third layers of oxide along the sidewalls and bottom of each opening, depositing a gate metal layer in each opening following the deposition of the first, second and third layers of oxide and forming a mono-crystalline channel for the multitude of NAND memory cells. The mono-crystalline channel is formed by applying at least a first voltage between each metal gate and the substrate to vary a resistivity of the polysilicon sidewalls, applying a second voltage between the silicon substrate and the metal layer to cause the polysilicon sidewalls to melt, and enabling the melted polysilicon sidewalls to recrystallize into the mono-crystalline channel.

Figure 10:
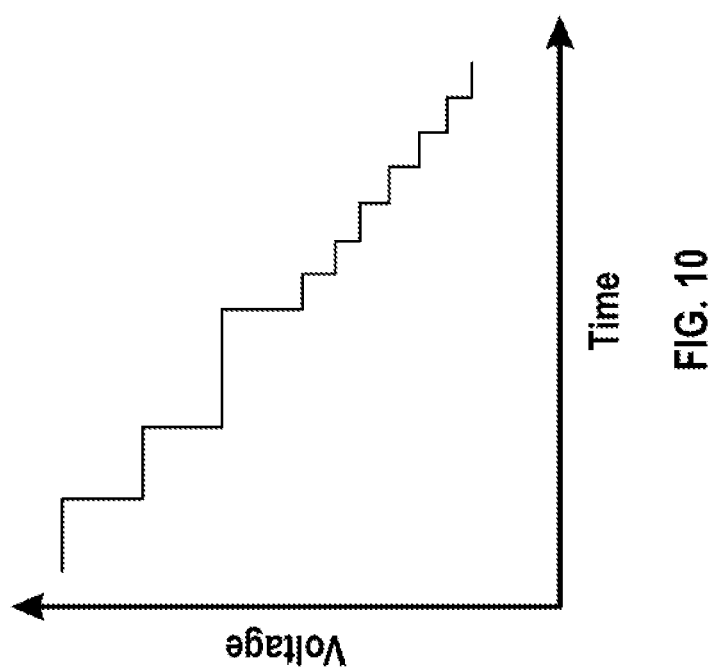
FIG. 10 is a timing diagram of decrementing voltage pulses that may be applied to the semiconductor of FIGS. 6 and 8 after the melting of the polysilicon sidewalls, in accordance with one exemplary embodiment of the present disclosure.

In some embodiments, in order to assist the propagation of the crystallization wave from the bottom of the melted polysilicon sidewalls (i.e., at the interface of substrate 50 and polysilicon sidewalls 70) and/or to control the positive feedback loop induced by the polysilicon resistivity decrease with increased temperature (thermal runaway), a series of decrementing voltage pulses may be applied to the memory structure, using, for example, metal layer 90 (or metal segment 12) and ohmic contact 95. FIG. 10 is an exemplary timing diagram of a decrementing voltage pulses that may be applied to the memory structures shown in FIGS. 6 and 8.

Figure 11:
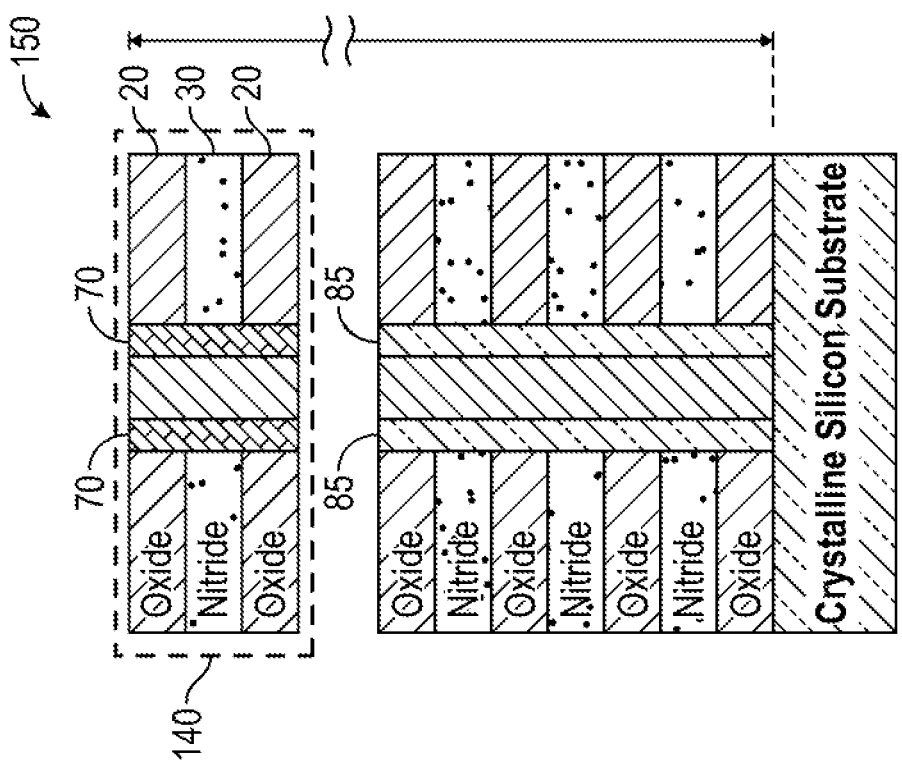
FIG. 11 shows the semiconductor structure of FIG. 7 after the removal of the metal and one or more layers of the stack, in accordance with one exemplary embodiment of the present disclosure.

In some embodiments, after melting and recrystallization of the polysilicon sidewalls to form channels 85, as described above, the top metal layer 90 as well as a portion of the top of the memory device structure is removed. For example, referring to memory structure 150 of FIG. 11, after the removal of metal layer 90 (or metal segment 12 shown in FIG. 8), a portion 140 of the memory structure is removed using, for example, an etching process or Chemical Mechanical Polishing (CMP). In FIG. 11, exemplary portion 140 is shown as including two layers of oxide 20, and a layer of nitride 30 together with the adjoining trench. However, it is understood that more layers of oxide and nitride in stack 10 may be removed. By removing portion 140, polysilicon sidewalls 70 in portion 140 that may not have gone through recrystallization due to premature heat loss from the top contact, are also removed. The remaining portion of memory structure 150 has a channel 85 that has crystallization uniformity. To accommodate such removal, the stack of alternating layers of oxide and nitride and the trench may be adapted to be longer than desired so that after the removal step, the trench reaches the desired length.

Figure 12:
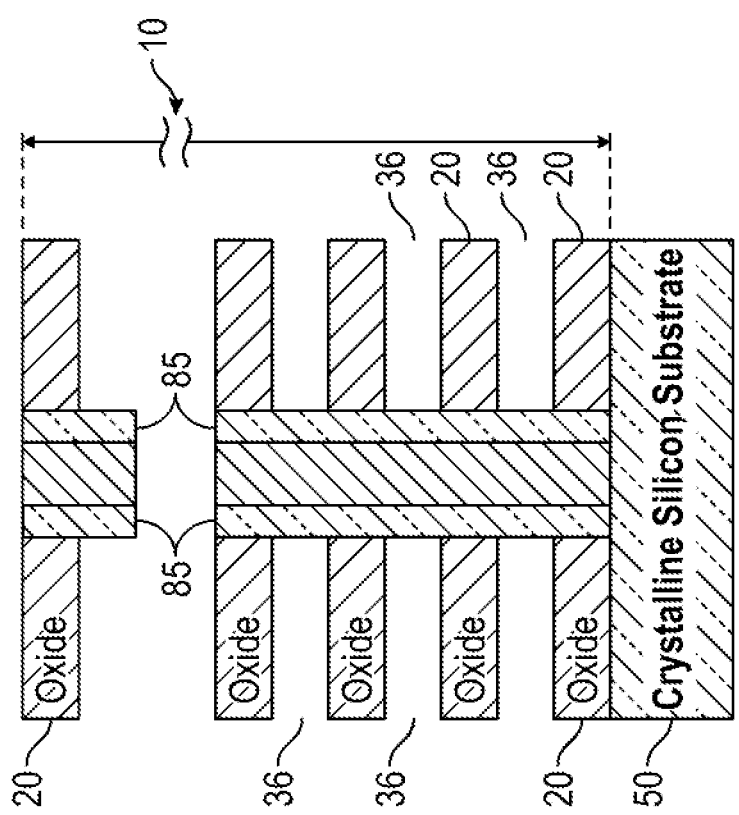
FIG. 12 shows the semiconductor structure of FIG. 7 after the removal of the metal and silicon nitride layers to form openings in the stack, in accordance with one exemplary embodiment of the present disclosure.

After the melting and crystallization of the polysilicon sidewalls, the removal of the metal layer/segment from the top of the memory structure, and optional removal of a portion of the top of the memory structure, as was described with reference to FIG. 11, the nitride layers 30 are removed using an etch process, thereby to form memory structure 160 shown in FIG. 12. The removal of the nitride layers results in the formation of openings 36 in stack 10 as shown in FIG. 12.

Figure 13:
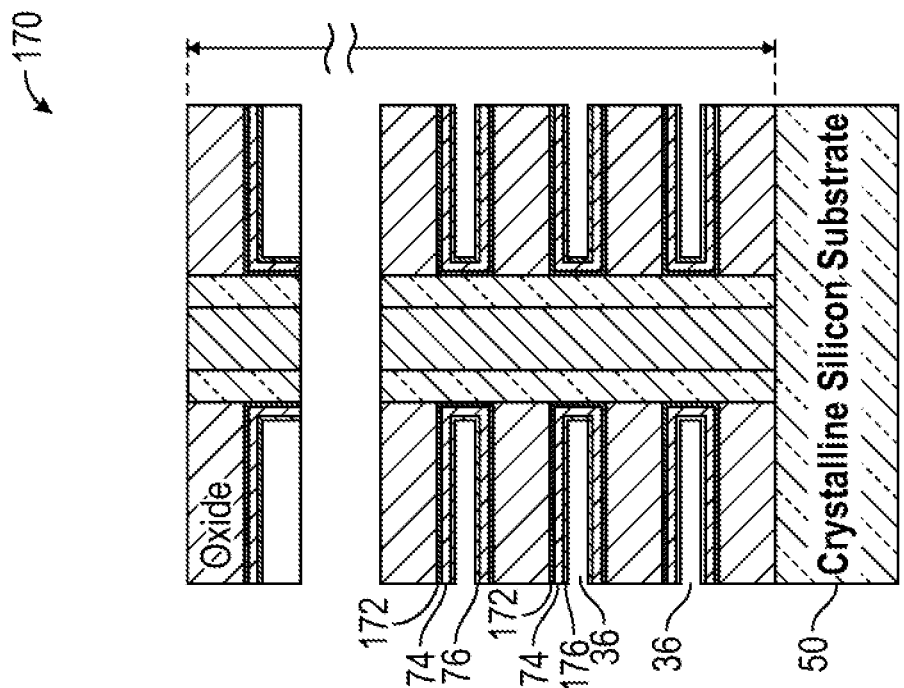
FIG. 13 shows the semiconductor structure of FIG. 12 after formation of tunnel oxide, storage oxide and blocking oxide along the bottom and sidewalls of the openings formed in the stack, in accordance with one exemplary embodiment of the present disclosure.
Figure 14:
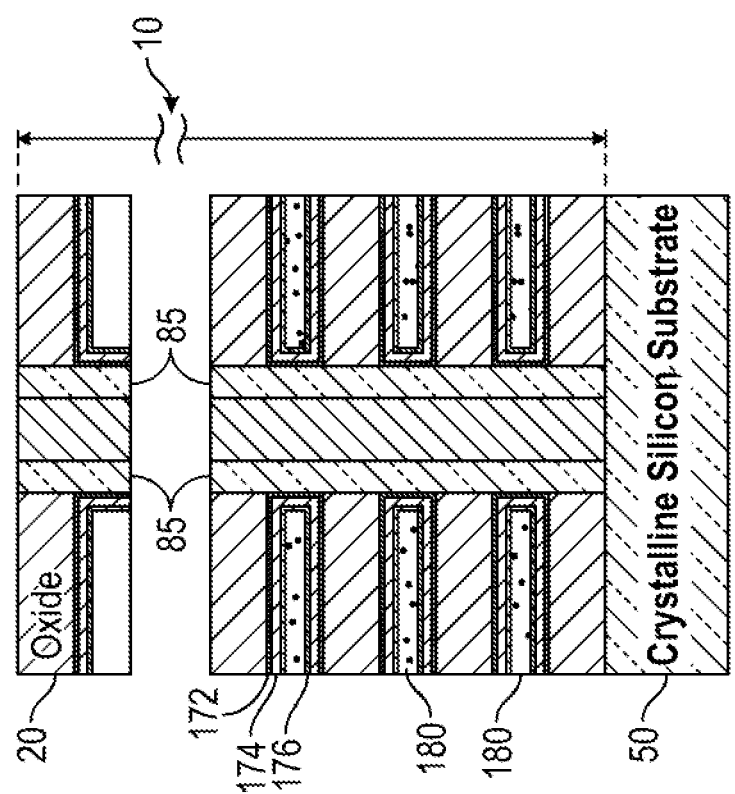
FIG. 14 shows the semiconductor structure of FIG. 13 after filling the openings of the stack with metal to form the gates of the 3D NAND memory cells, in accordance with one exemplary embodiment of the present disclosure.

Next, a layer of tunnel oxide 172, a layer of storage oxide 174 and a layer of blocking oxide 176 are formed along sidewalls and bottom of each opening 36 as shown in FIG. 13. Thereafter, a layer of metal 180 is deposited in each opening 36, as shown in FIG. 14. Each metal 180 forms a gate of a NAND memory cell. Each gate 180 together with its associated tunnel oxide 172, storage oxide 174, and blocking oxide 176 formed in the same opening 36, forms a vertical NAND memory cell. The channel for each such memory cells is the portion of the mono-crystalline silicon channel 85 facing the tunnel oxide 172, as is known. A memory structure, such as that shown in FIG. 14, may have, for example, 100 NAND memory cells in vertical stack 10.

FIGS. 15 through 21 show various processing steps used in forming a string of vertical 3D NAND memory cells, in accordance with another embodiment of the present disclosure. FIG. 15 shows a stack 300 of alternating layers of oxide 20 and metal (such as Tungsten) 30 formed over a crystalline silicon substrate 350 using a deposition method, patterning and etching steps Next, as shown in FIG. 16, trench 360 that extends to the surface of substrate 350 is formed using masking and patterning steps in stack 300.

Figure 18:
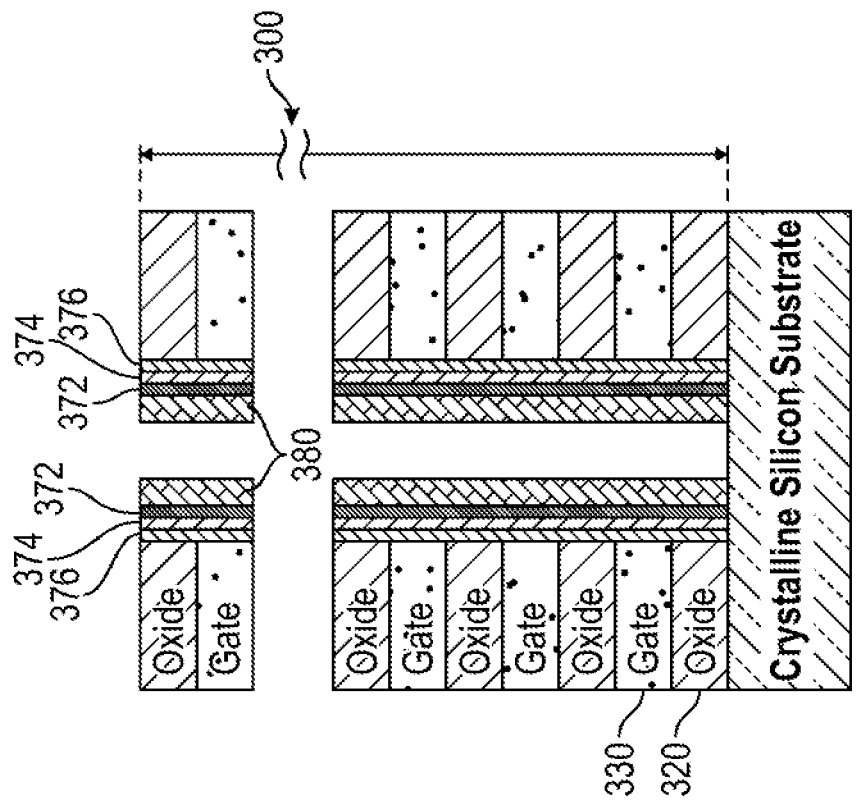
FIG. 18 shows the semiconductor structure of FIG. 17 after formation of polysilicon adjacent the tunnel oxide and along the sidewalls of the trench, in accordance with one exemplary embodiment of the present disclosure.
Figure 17:
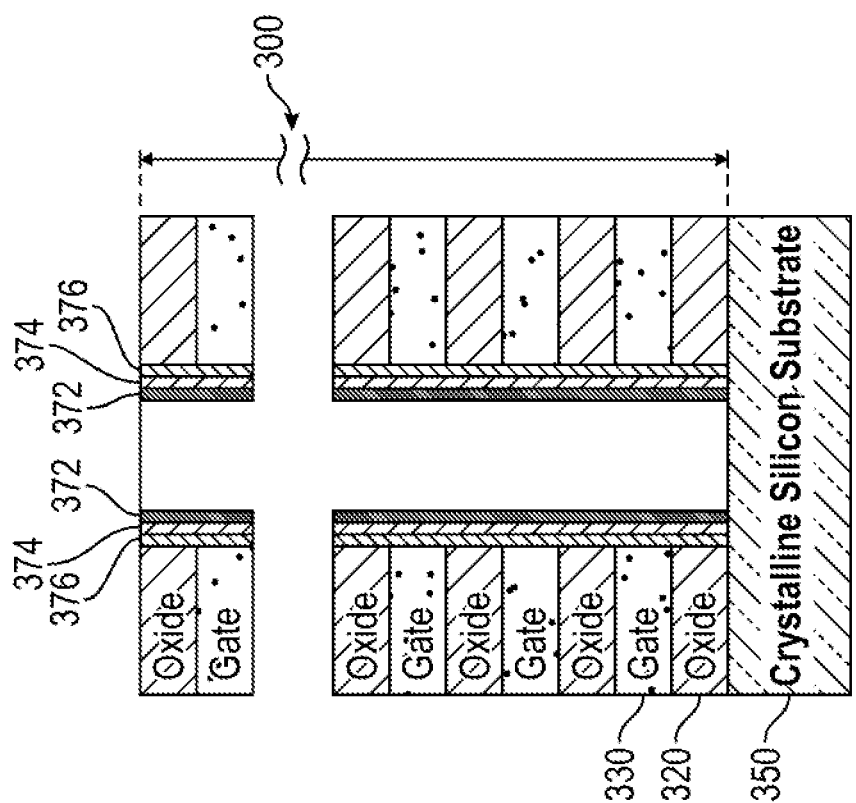
FIG. 17 shows the semiconductor structure of FIG. 16 after formation of tunnel oxide, storage oxide and blocking oxide along the sidewalls of the trench, in accordance with one exemplary embodiment of the present disclosure.

Next, a layer of blocking oxide 376, a layer of storage oxide 374, and layer of tunnel oxide 372, are deposited respectively along the sidewalls of the trench, as shown in FIG. 17. Thereafter, a layer of polysilicon 380 is formed along the sidewalls of the trench and adjacent tunnel oxide layer 372, as shown in FIG. 18. Thereafter, as shown in FIG. 19, the trench is filled with oxide 390.

Figures 19, 20:
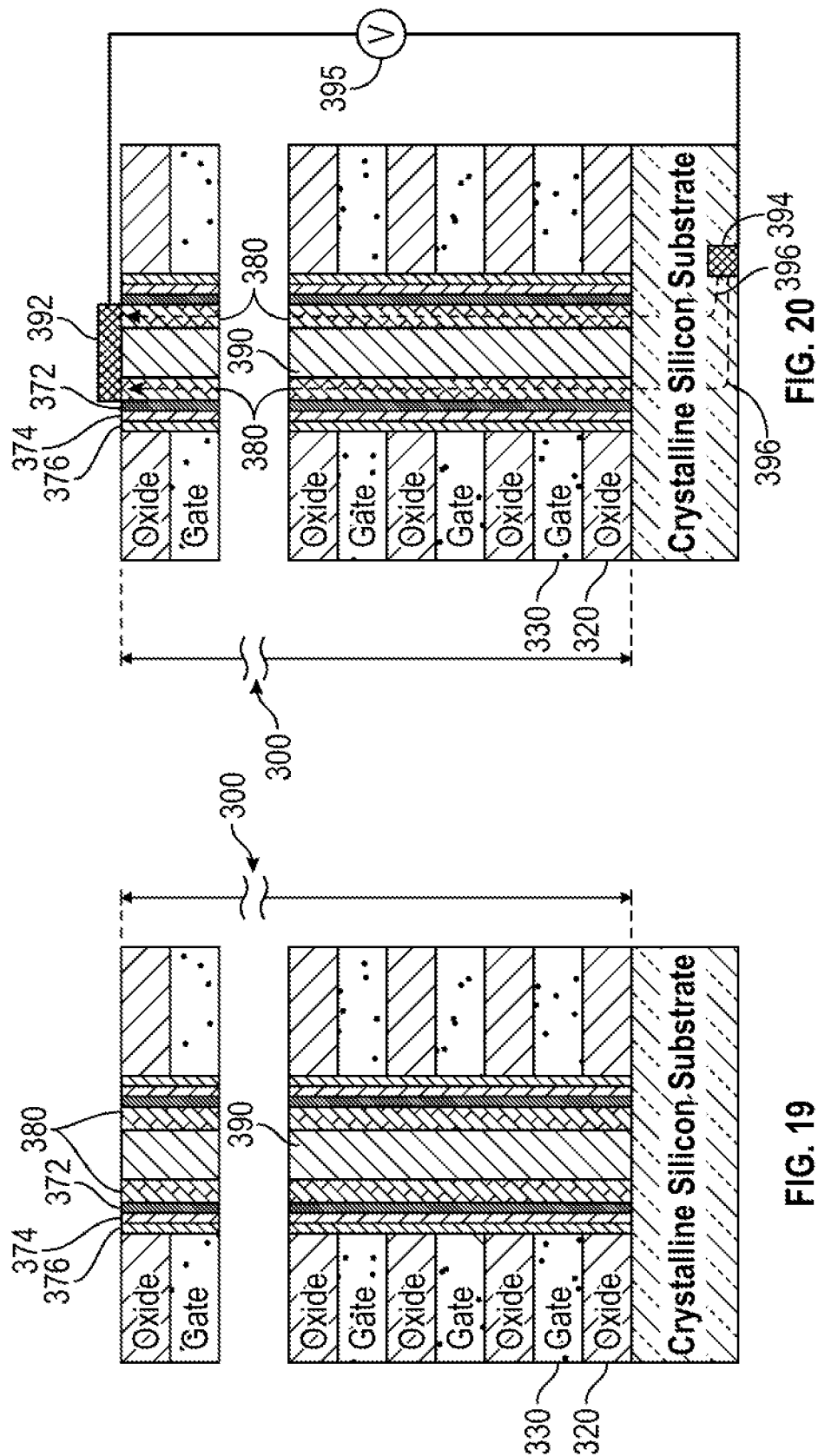
FIG. 19 shows the semiconductor structure of FIG. 18 after filling the trench with silicon dioxide, in accordance with one exemplary embodiment of the present disclosure.
FIG. 20 shows the semiconductor structure of FIG. 19 after formation of a metal segment above the trench and polysilicon sidewalls, formation of an ohmic contact in the substrate and application of a voltage between the metal segment and the ohmic contact, in accordance with one exemplary embodiment of the present disclosure.

Next, as shown in FIG. 20, a layer of metal 392 is formed over polysilicon sidewalls 380 and oxide 390. In some embodiments (not shown) metal layer 392 covers the top surface of stack 300. After an ohmic contact 394 is formed in substrate 350, a voltage 396 is applied between metal layer 392 and ohmic contact 394. The applied voltage causes a current to flow (shown using dashed lines 396) between the two metal contacts and through the polysilicon sidewalls 380 to cause local melting of the polysilicon sidewalls. The voltage level is determined, in part, by the intrinsic resistance of the polysilicon sidewalls.

After the melting condition has been reached in the polysilicon sidewalls, the voltage is removed to enable the melted polysilicon to cool down. Because the silicon substrate 350 represents a relatively large heat sink, the melted polysilicon cools down and starts to recrystallize at the interface between the polysilicon and silicon substrate 350. The recrystallization will then propagate from the bottom (i.e., the interface between polysilicon and substrate 350) to the top of the polysilicon near the surface of stack 300. Therefore, in accordance with embodiments of the present disclosure, the melting of the polysilicon sidewalls is achieved by the Joule effect and the recrystallization of the melted polysilicon is achieved by differential and asymmetric heat dissipation.

Figure 21:
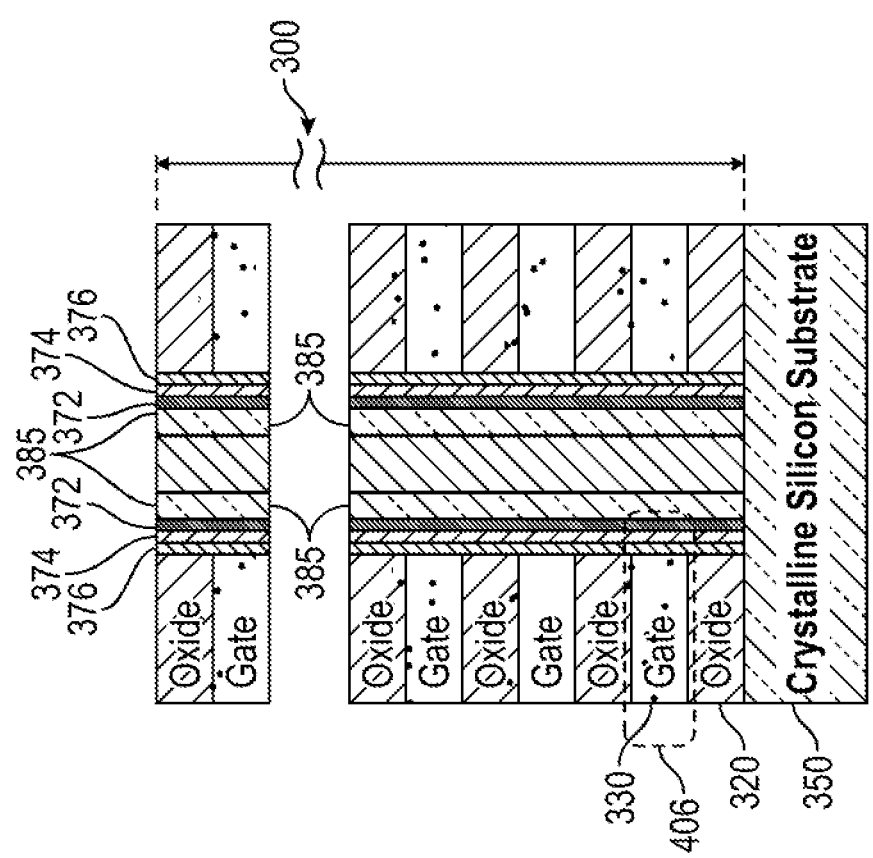
FIG. 21 shows the semiconductor structure of FIG. 20 after melting and recrystallization of the polysilicon sidewalls to form channels of the 3D NAND memory cells, in accordance with one exemplary embodiment of the present disclosure.

FIG. 21 shows the memory device structure of FIG. 20 after the polysilicon sidewalls are melted and crystalized to form memory cell channels 385. Each metal layer 330 together with its associated tunnel oxide 372, storage oxide 374, blocking oxide 376 and a portion of the mono-crystalline silicon channel 385 facing the tunnel oxide 172 form a NAND memory cell in stack 300. One such NAND cell is identified in FIG. 21 as NAND memory cell 400.

FIG. 23A shows a semiconductor memory structure 500 that is similar to the memory structure shown in FIG. 21 except that memory structure 500 includes polysilicon sidewalls 380 that have not been caused to melt and recrystallize. After application of a voltage (not shown) between metal layer 392 and ohmic contact 394 of memory structure 500, polysilicon sidewalls 380 are caused to melt and recrystallize to form mono-crystalline silicon channels. FIG. 23B shows the memory structure of FIG. 23A after the application of such a voltage subsequent to which polysilicon sidewalls 380 are caused to melt and recrystallize to form mono-crystalline silicon channels 385. Referring to FIG. 23A, by varying the voltage applied to metal gates 370, and therefore, by changing the resistivity of polysilicon sidewalls 380, the voltage level required to cause polysilicon sidewalls 380 to melt may be varied.

A method of forming a multitude of vertically oriented NAND memory cells, in accordance with one embodiment of the present disclosure, includes, in part, forming a multitude of alternating layers of metal gates and oxide on a silicon substrate, forming a trench in the alternating layers of the metal gates and oxide to expose a surface of the silicon substrate, depositing a first layer of oxide, a second layer of oxide, and a third layer of oxide along the sidewalls of the trench, depositing a layer of polysilicon along the sidewalls of the trench and adjacent the first layer of oxide in the trench, filling the trench with oxide, forming a metal layer above the trench; and forming a mono-crystalline channel for the plurality of NAND memory cells. The mono-crystalline channel is formed by applying at least a first voltage between each metal gate and the substrate to vary a resistivity of the polysilicon sidewalls, applying a second voltage between the silicon substrate and the metal layer to cause the polysilicon sidewalls to melt, and enabling the melted polysilicon sidewalls to recrystallize into the mono-crystalline channel.

Figure 24:
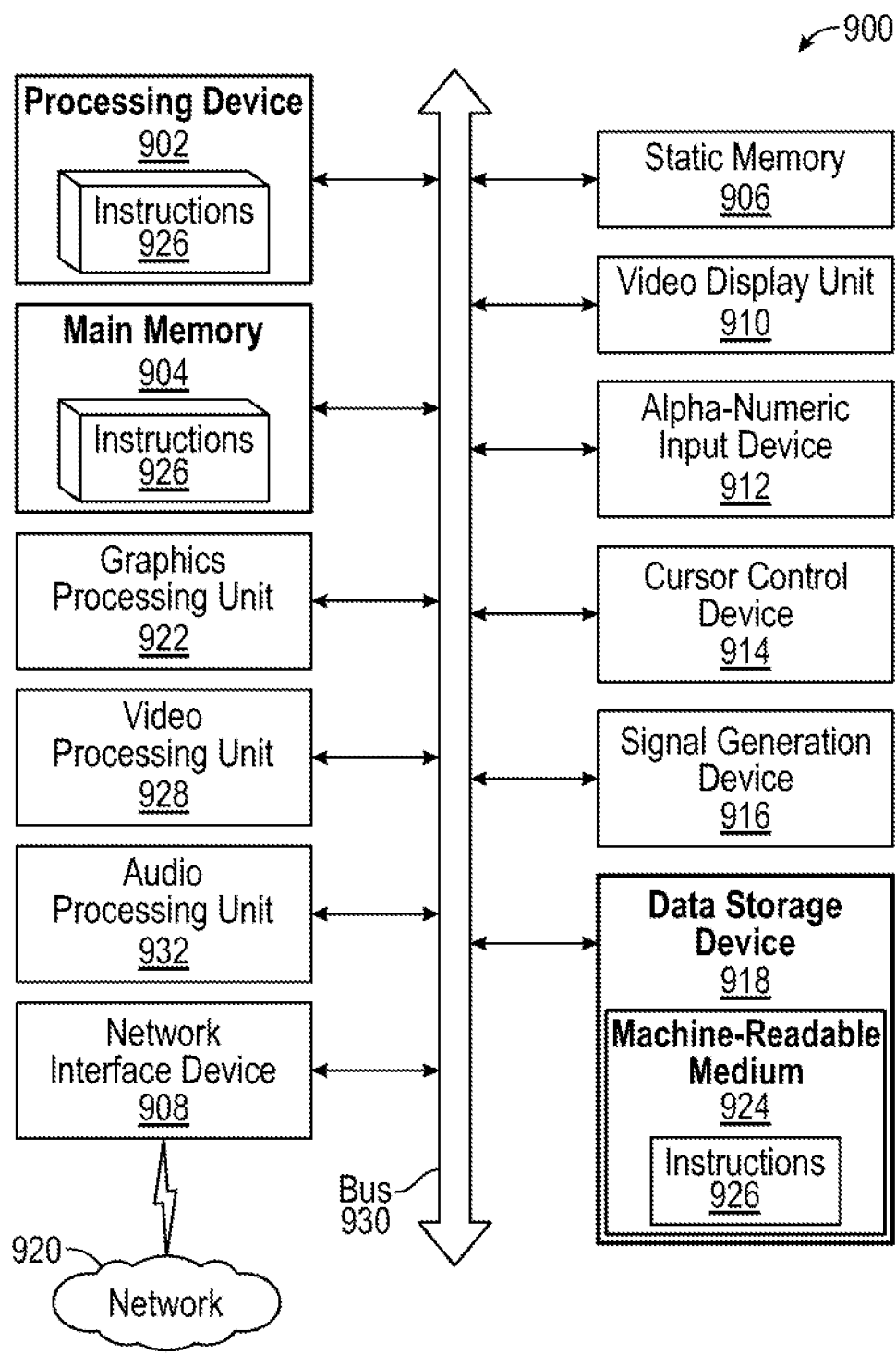
FIG. 24 shows an abstract diagram of an example computer system in which embodiments of the present disclosure may operate.

FIG. 24 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of forming a plurality of vertical NAND memory cells, the method comprising:
   forming a plurality of insulating materials on a silicon substrate;
   forming a trench in the plurality of insulating materials, wherein the trench exposes a surface of the silicon substrate;
   depositing a layer of polysilicon along sidewalls of the trench to form polysilicon sidewalls;
   filling the trench with oxide;
   forming a metal layer above the trench; and
   forming a mono-crystalline channel for the plurality of NAND memory cells by:
      applying a voltage between the silicon substrate and the metal layer to cause the polysilicon sidewalls to melt; and
      enabling the melted polysilicon sidewalls to recrystallize into the mono-crystalline channel.

2. The method of claim 1 further comprising:
   forming the metal layer above the plurality of insulating materials.

3. The method of claim 1 wherein forming of the channel comprises:
   forming an epitaxial layer near a bottom of the trench.

4. The method of claim 1 wherein forming of the channel comprises:
   forming an epitaxial layer near a top of the trench.

5. The method of claim 1 further comprising:
   removing a portion of the trench and the plurality of insulating materials.

6. The method of claim 1 further comprising:
   applying a plurality of voltage pulses between the metal layer and the silicon substrate after the application of the voltage.

7. The method of claim 1 wherein the plurality of insulating materials comprises alternating layers of oxide and nitride.

8. The method of claim 7 further comprising:
   removing the nitride layers to form a plurality of openings along the trench, each opening associated with and adapted to form a different one of the plurality of NAND memory cells; and
   depositing at least first and second layers of oxide along sidewalls and a bottom of each opening, wherein the first layer of oxide forms a tunnel oxide of the associated NAND memory cell and the second layer of oxide forms a storage oxide of the associated NAND memory cell.

9. The method of claim 8 further comprising:
depositing at least a third layer of oxide along the sidewalls and the bottom of each opening.

10. The method of claim 9 further comprising:
depositing a metal layer in each opening following the deposition of the third layer of oxide.

11. The method of claim 1 wherein said voltage is defined by a resistivity of the polysilicon sidewalls.

12. A method of forming a plurality of vertical NAND memory cells, the method comprising:
forming a plurality of alternating layers of metal and oxide on a silicon substrate;
forming a trench in the plurality of alternating layers of the metal and oxide, the trench exposing a surface of the silicon substrate;
depositing a first layer of oxide, a second layer of oxide, and a third layer of oxide along sidewalls of the trench,
depositing a layer of polysilicon along sidewalls of the trench and adjacent the first layer of oxide in the trench thereby to form polysilicon sidewalls;
filling the trench with oxide;
forming a metal layer above the trench; and
forming a mono-crystalline channel for the plurality of NAND memory cells by:
applying a voltage between the silicon substrate and the metal layer to cause the polysilicon sidewalls to melt; and
enabling the melted polysilicon sidewalls to recrystallize into the mono-crystalline channel.

13. The method of claim 12 further comprising:
forming the metal layer above the plurality of alternating layers of metal and oxide.

14. The method of claim 12 further comprising:
forming an epitaxial layer near a bottom of the trench.

15. The method of claim 12 further comprising:
forming an epitaxial layer near a top of the trench.

16. The method of claim 12 further comprising:
removing a portion of the trench and the plurality of alternating layers of metal and oxide.

17. The method of claim 12 further comprising:
applying a plurality of voltage pulses between the metal layer and the silicon substrate after the application of the voltage.

18. The method of claim 17 wherein a voltage pulse height applied between a first point in time and a second point in time is higher than a voltage pulse height applied between the second point in time and a third point in time, wherein the first point in time occurs before the second point in time, and wherein the second point in time occurs before the third point in time.

19. The method of claim 12 wherein said voltage is defined by a resistivity of the polysilicon sidewalls.

* * * * *